(12) United States Patent
Castro Lisboa

(10) Patent No.: US 12,483,244 B2
(45) Date of Patent: Nov. 25, 2025

(54) BUFFER WITH REDUCED SHOOT-THROUGH CURRENT

(71) Applicant: Allegro MicroSystems, LLC, Manchester, NH (US)

(72) Inventor: Pablo Castro Lisboa, Montevideo (UY)

(73) Assignee: Allegro MicroSystems, LLC, Manchester, NH (US)

( * ) Notice: Subject to any disclaimer, the term of this patent is extended or adjusted under 35 U.S.C. 154(b) by 259 days.

(21) Appl. No.: 18/450,453

(22) Filed: Aug. 16, 2023

(65) Prior Publication Data

US 2025/0062764 A1   Feb. 20, 2025

(51) Int. Cl.
  *H03K 5/134*   (2014.01)
  *H03K 5/1534*  (2006.01)
  *H03K 19/003*  (2006.01)

(52) U.S. Cl.
  CPC ....... *H03K 19/00361* (2013.01); *H03K 5/134* (2014.07); *H03K 5/1534* (2013.01)

(58) Field of Classification Search
  None
  See application file for complete search history.

(56) References Cited

U.S. PATENT DOCUMENTS

| | | |
|---|---|---|
| 6,356,741 B1 | 3/2002 | Bilotti et al. |
| 8,008,908 B2 | 8/2011 | Doogue et al. |
| 8,222,888 B2 | 7/2012 | David et al. |
| 10,345,417 B2 | 7/2019 | Geisler |
| 10,635,539 B2 | 4/2020 | Cook et al. |
| 10,948,537 B2 | 3/2021 | Forrest et al. |
| 11,057,023 B1* | 7/2021 | Abesingha ........... H03K 17/687 |
| 11,152,938 B2 | 10/2021 | Judkins, III et al. |
| 11,624,799 B2 | 4/2023 | Cesaretti et al. |
| 2023/0152393 A1 | 5/2023 | Haas et al. |

OTHER PUBLICATIONS

U.S. Appl. No. 18/053,905, filed Nov. 9, 2022, Thomas, et al.
Allegro MicroSystems Datasheet "A3213 and A3214, Micropower Ultra-Sensitive Hall-Effect Switches", Allegro MicroSystems, Oct. 31, 2016, 12 pages.
Allegro MicroSystems Datasheet "A3211 and A3212, Micropower Ultrasensitive Hall-Effect Switches", Allegro MicroSystems, Feb. 16, 2022, 13 pages.

* cited by examiner

*Primary Examiner* — Cassandra F Cox
(74) *Attorney, Agent, or Firm* — DALY, CROWLEY, MOFFORD & DURKEE, LLP

(57) ABSTRACT

A buffer includes a first branch to receive a digital input signal and generate a first intermediate signal having falling edges that are delayed and faster than rising edges of the digital input signal and rising edges that are substantially coincident with falling edges of the digital input signal and a second branch to receive the digital input signal and generate a second intermediate signal having rising edges that are delayed and faster than falling edges of the digital input signal and falling edges that are substantially coincident with rising edges of the digital input signal. An output stage has a first input to receive the first intermediate signal, a second input to receive the second intermediate signal, and an output at which a buffer output signal is provided as a delayed version of the digital input signal having faster rising and falling edges than the digital input signal.

14 Claims, 6 Drawing Sheets

BUFFER WITH REDUCED SHOOT-THROUGH CURRENT

BACKGROUND

As is known, sensors are used in various types of devices to measure and monitor properties of targets and systems in a wide variety of applications. Some sensors operate by detecting a magnetic field associated with proximity or movement of a target object with respect to one or more magnetic field sensing elements. For example, magnetic switch sensors are used to detect proximity of a target to one or more magnetic field sensing elements of the sensor, which target and sensor are capable of motion relative to one another.

Magnetic field sensors for sensing a magnetic field in low power applications are known. Such sensors typically employ internal timing circuitry to activate portions of the device for a small percentage of the duty cycle. For example, such devices can include a low power feature whereby portions of the device are activated for only a short, "awake" time interval during each clock cycle. Low power applications include battery-operated, handheld equipment, such as cellular and cordless telephones, pagers, palmtop or handheld computers, personal digital assistants (PDAs), and the like.

Buffer circuits are often used to generate a digital signal to drive digital portions (e.g., logic gates) of the sensor. The input signal to a buffer circuit can, for example, be a digital clock signal. Slow signal transitions of the buffer output signal can cause a plurality of logic gates to be active at the same time, thereby resulting in so-called "shoot-through" current. Shoot-through currents can increase power dissipation, as can be particularly undesirable in low power applications.

SUMMARY

The present disclosure provides circuits and methods for buffering a digital input signal in a way that reduces and/or eliminates shoot-through current. These advantages are achieved with symmetrical circuit branches including starved inverter and signal recovery stages designed to generate intermediate signals, one of which has faster and delayed falling edges with respect to the digital input signal and the other one of which has faster and delayed rising edges with respect to the digital input signal. The intermediate signals are combined in a break before make fashion (i.e., transition times of the intermediate signals do not overlap) to generate a buffer output signal, thereby reducing shoot-through current and power dissipation that can result from shoot-through current. The buffer output signal is a delayed version of the digital input signal, with faster rise and fall times than the digital input signal.

According to the disclosure a buffer includes a first branch configured to receive a digital input signal and generate a first intermediate signal having falling edges that are delayed and faster than rising edges of the digital input signal and rising edges that are substantially coincident with falling edges of the digital input signal and a second branch configured to receive the digital input signal and generate a second intermediate signal having rising edges that are delayed and faster than falling edges of the digital input signal and falling edges that are substantially coincident with rising edges of the digital input signal. An output stage has a first input coupled to receive the first intermediate signal, a second input coupled to receive the second intermediate signal, and an output at which a buffer output signal is provided, wherein the buffer output signal is a delayed version of the digital input signal having faster rising and falling edges than the digital input signal.

Features may include one or more of the following individually or in combination with other features. Each of the first branch and the second branch can include at least one starved inverter stage having an input node coupled to receive the digital input signal and an output node and at least one signal recovery stage having an input node coupled to the output node of the at least one starved inverter stage and an output node at which the first intermediate signal or the second intermediate signal is provided. The at least one starved inverter stage can include a CMOS inverter and current source, wherein the current source is a PMOS current source or an NMOS current source. The at least one signal recovery stage can include a CMOS inverter and current source, wherein the current source is a PMOS current source or an NMOS current source. The at least one signal recovery stage can include the same type of current source as the at least one starved inverter stage to which it is coupled. Each of the first branch and the second branch can include a plurality of series-coupled starved inverter stages with a first one coupled to receive the digital input signal and a last one having the output node coupled to the at least one signal recovery stage. Each of the first branch and the second branch can include a plurality of series-coupled signal recovery stages with a first one coupled to the output node of the at least one starved inverter stage and a last one having an output node at which the first intermediate signal or the second intermediate signal is provided. The output stage can include a break before make structure coupled across power connections and including a first pair of CMOS switches, each coupled to receive the first intermediate signal and a second pair of CMOS switches, each coupled to receive the second intermediate signal, wherein the first pair of CMOS switches is interleaved with respect to the second pair of CMOS switches.

Also described is a method for generating a buffer output signal having faster edges than a digital input signal, including generating a first intermediate signal having delayed and faster falling edges with respect to rising edges of the digital input signal, generating a second intermediate signal having delayed and faster rising edges with respect to falling edges of the digital input signal, and combining the first and second intermediate signals to generate the buffer output signal as a delayed version of the digital input signal having faster rising and falling edges than the digital input signal.

Features may include one or more of the following individually or in combination with other features. Combining the first and second intermediate signals can include coupling the first and second intermediate signals to a break before make structure coupled across power connections. Coupling the first and second intermediate signals to a break before make structure can include coupling the first intermediate signal to a first pair of CMOS switches comprising a PMOS switch and an NMOS switch and coupling the second intermediate signal to a second pair of CMOS switches comprising a PMOS switch and an NMOS switch, wherein the first pair of CMOS switches is interleaved with the second pair of CMOS switches. Generating the first intermediate signal can include coupling the digital input signal to a first branch including at least one starved inverter stage having an input node coupled to receive the digital input signal and an output node and at least one signal recovery stage having an input node coupled to the output node of the at least one starved inverter stage and an output node at which the first intermediate signal is provided and wherein generating the second intermediate signal can include coupling the digital input signal to a second branch including at least one starved inverter stage having an input node coupled to receive the digital input signal and an output node and at least one signal recovery stage having an input node coupled to the output node of the at least one starved inverter stage and an output node at which the second intermediate signal is provided. Generating the first intermediate signal can include coupling the digital input signal to a first one of a plurality of series-coupled starved inverter stages, with a first one coupled to receive the digital input signal and a last one having the output node coupled to the at least one signal recovery stage and wherein generating the second intermediate signal can include coupling the digital input signal to a first one of a plurality of series-coupled starved inverter stages, with a first one coupled to receive the digital input signal and a last one having the output node coupled to the at least one signal recovery stage. Generating the first intermediate signal further can include coupling the last one of the plurality of series-coupled starved inverter stages of the first branch to a first one of a plurality of series-coupled signal recovery stages, wherein the first intermediate signal is generated by a last one of the plurality of series-coupled signal recovery stages of the first branch and wherein generating the second intermediate signal further can include coupling the last one of the plurality of series-coupled starved inverter stages of the second branch to a first one of a plurality of series-coupled signal recovery stages, wherein the second intermediate signal is generated by a last one of the plurality of series-coupled signal recovery stages of the second branch.

Also described is apparatus for generating a buffer output signal having faster edges than a digital input signal, including means for generating a first intermediate signal having delayed and faster falling edges than rising edges of the digital input signal, means for generating a second intermediate signal having delayed and faster rising edges than falling edges of the digital input signal, and means for combining the first intermediate signal and the second intermediate signal to generate the buffer output signal.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
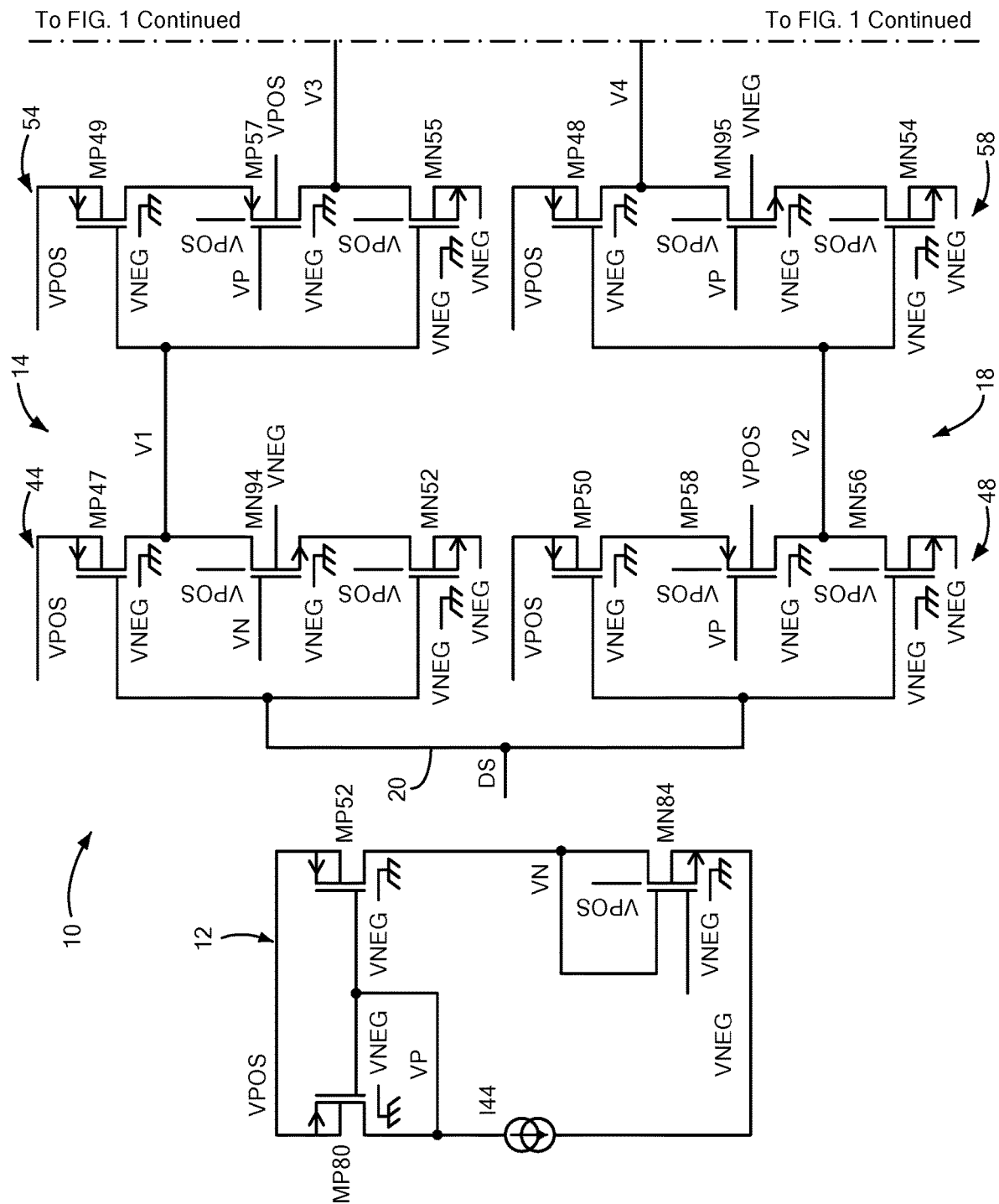
FIG. 1 is a schematic of a buffer according to the disclosure.
Figure 1:
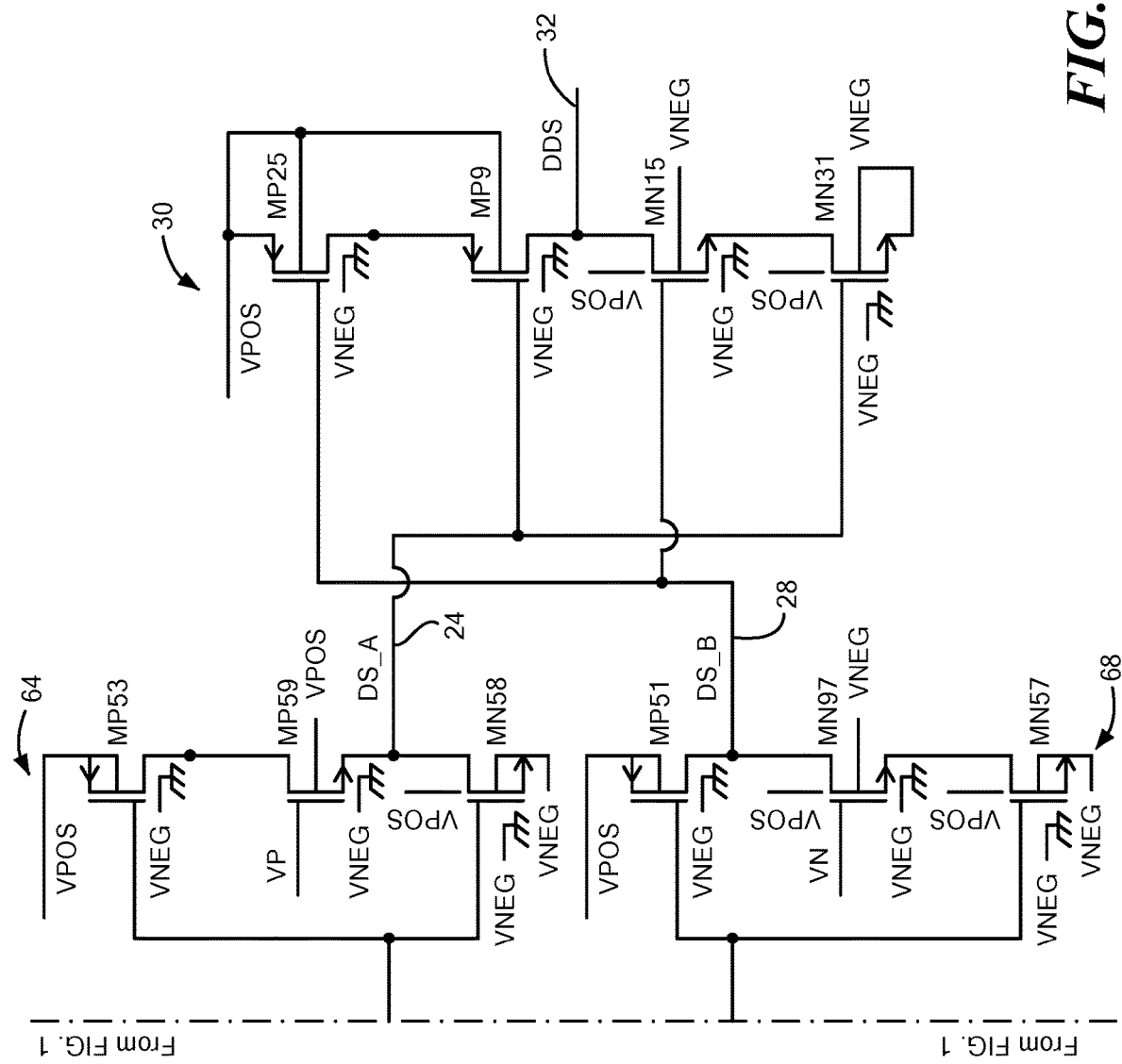

Referring to FIG. 1, a buffer 10 according to the disclosure includes circuit branches 14, 18, each of which is configured to receive a digital input signal DS 20. The first circuit branch 14 generates a first intermediate signal DS_A 24 having falling edges that are delayed and faster than rising edges of the digital input signal 20 and rising edges that are substantially coincident with falling edges of the digital input signal. The second circuit branch 18 generates a second intermediate signal DS_B 28 having rising edges that are delayed and faster than falling edges of the digital input signal 20 and falling edges that are substantially coincident with rising edges of the digital input signal. An output stage 30 has a first input coupled to receive the first intermediate signal 24, a second input coupled to receive the second intermediate signal 28, and an output at which a buffer output signal DDS 32 is provided. The buffer output signal 32 is a delayed version of the digital input signal 20 but with faster rising and falling edges than the digital input signal.

The digital input signal 20 can be a clock signal that has relatively slow edges, or transitions. In applications in which the digital input signal 20 drives a network of logic gates, its slow edges can result in shoot-through current and associated power dissipation. The described buffer output signal 32 with faster edges than the digital input signal 20 advantageously reduces the occurrence of shoot-through current.

Each circuit branch 14, 18 includes at least one starved inverter stage and at least one signal recovery stage. In the example buffer 10 of FIG. 1, each circuit branch 14, 18 includes two starved inverter stages 44, 54 and 48, 58, respectively, and a single signal recovery stage 64, 68, as shown. It will be appreciated by those of ordinary skill in the art that more or fewer starved inverter stages and more signal recovery stages than shown in FIG. 1 can be provided, as will be described in connection with FIG. 3.

In the example buffer 10, each starved inverter stage and signal recovery stage includes CMOS switches coupled to invert an input signal in a controlled fashion as will be explained. To this end, each such stage includes a PMOS current source or an NMOS current source. For example, stage 44 includes NMOS current source MN94 and stage 54 includes PMOS current source MP57.

Each such current source is coupled to receive a reference voltage VP in the case of PMOS current sources or a reference voltage VN in the case of NMOS current sources. A circuit 12 can be configured to generate reference voltages VP, VN and includes a current mirror of PMOS FET MP80 and PMOS FET MP52. FET MP52 is coupled in series with a diode-connected NMOS FET MN84 and a current source 144 coupled to FET MP80 controls conduction of FETs MP80, MP52 and thus, the voltage level of the reference voltages VP, VN.

The starved inverter stage(s) and signal recovery stage(s) are series-coupled. For example, in the first branch 14, an output of the first starved inverter stage 44 (at which a voltage V1 is provided) is coupled to an input of the second starved inverter stage 54 and an output of the second starved inverter stage 54 (at which a voltage V3 is provided) is coupled to an input of signal recovery stage 64. In the second branch 18, an output of the first starved inverter stage 48 (at which a voltage V2 is provided) is coupled to an input of the second starved inverter stage 58 and an output of the second starved inverter stage 58 (at which a voltage V4 is provided) is coupled to an input of signal recovery stage 68.

In general, the purpose of the starved inverter stage(s) is to invert the input signal of the inverter stage in a way that delays the input signal in one edge direction and not in the other edge direction and also increases the edge speed (i.e., reduces the signal transition time) of the edges that are not delayed. By "delay" it is meant that the signal edge occurs later in time, as opposed to being "substantially coincident" with a signal edge. For example, a starved inverter stage can delay falling edges of the input signal but not rising edges or vice versa. The delay is accomplished by limiting the current (i.e., starving the current) in the inverter stage in the edge direction to be delayed with the use of a current source. For example, starved inverter stage 44 includes an NMOS current source MN94 coupled between a PMOS FET MP47 and an NMOS FET MN52, with the output signal V1 of the inverter stage provided between FETs MP47 and MN94, as shown. With this arrangement, current source MN94 limits the pull-down current of signal V1, thereby delaying the falling edges of V1 with respect to rising edges of input signal 20. A signal edge speed is increased by pulling up or down the inverter stage output signal quickly (i.e., with a fast turn on or off of a pull-up or pull-down transistor, respectively). In other words, rising edges of V1 are faster than falling edges of input signal 20 as is accomplished by not having a current source limiting the capacity of PMOS FET MP47 to delivery current.

Figure 2:
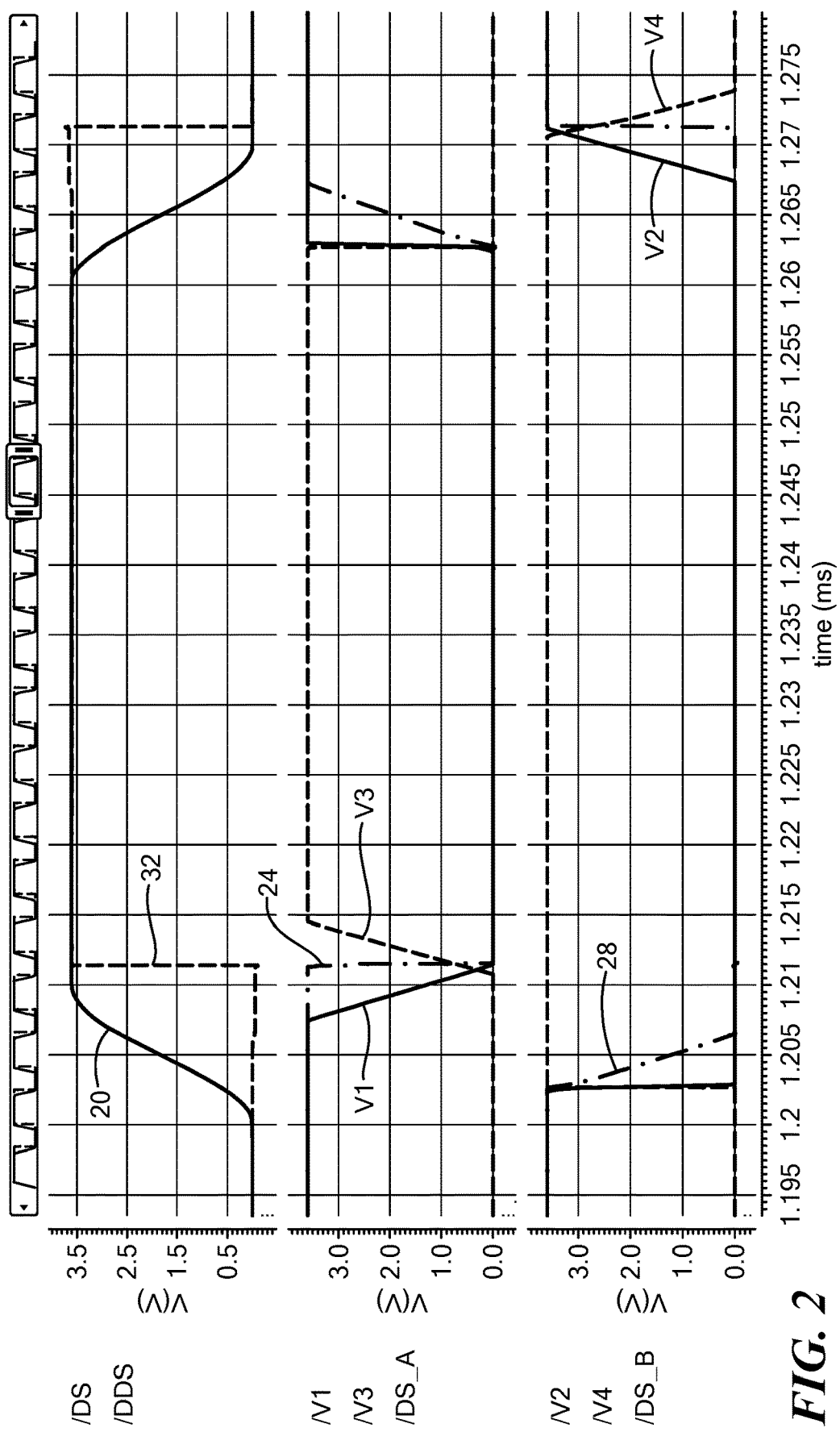
FIG. 2 shows waveforms associated with the buffer of FIG. 1.

Referring also to FIG. 2, example waveforms associated with buffer 10 are shown, with voltage on the vertical axis in units of volts and time on the horizontal axis in units of milliseconds. The digital input signal 20 is shown with the buffer output signal 32 which is a delayed version of the digital input signal, but with faster rising and falling edges. Also shown for the first branch 14 are the output signal V1 of the first starved inverter stage 44, the output signal V3 of the second starved inverter stage 54, and the first intermediate signal DS_A 24 provided by the signal recovery stage 64. Similarly, for the second branch 18, the output signal V2 of the first starved inverter stage 48, the output signal V4 of the second starved inverter stage 58, and the second intermediate signal DS_B 28 provided by the signal recovery stage 68 are shown.

Considering operation of the first inverter stage 44 of first circuit branch 14, rising edges of digital input signal 20 cause NMOS FET MN52 to turn on and PMOS FET MP47 to turn off. NMOS current source MN94 limits the fall time of signal V1 and in this way delays falling edges of signal V1 with respect to rising edges of input signal 20. On the other hand, falling edges of the digital input signal 20 turn on PMOS FET MP47 and turn off NMOS FET MN52, thereby causing signal V1 to rapidly rise to the level of VPOS and increasing the speed of the rising edges of signal V1. Thus, inverter stage 44 generates a voltage V1 that is inverted with respect to digital input signal 20, has delayed falling edges with respect to rising edges of digital input signal 20, and has faster rising edges than falling edges of digital input signal 20.

Considering operation of the second inverter stage 54 of first circuit branch 14, rising edges of signal V1 cause NMOS FET MN55 to turn on and PMOS FET MP49 to turn off, thereby causing signal V3 to rapidly fall to the level of VNEG to increase the speed of the falling edges of signal V3 with respect to rising edges of signal V1. Falling edges of signal V1 cause PMOS FET MP49 to turn on and NMOS FET MN55 to turn off. PMOS current source MP57 limits the rise time of signal V3 and in this way delays rising edges of signal V3 with respect to falling edges of V1. Thus, the second starved inverter stage 54 of the first circuit branch generates a voltage V3 that is inverted with respect to signal V1, has delayed rising edges with respect to falling edges of signal V1, and falling edges that are faster than rising edges of signal V1.

The purpose of the signal recovery stage(s) is to increase signal edge speed in one edge direction and not the other edge direction. For example, a signal recovery stage can speed up falling edges of its input signal but not rising edges or vice versa. In the context of the described buffer 10, the first signal recovery stage(s) in a circuit branch can be considered to "recover" the fast signal edge speed (e.g., signal recovery stage 64 operates on signal V3 that has slower rising edges and signal recovery stage 64 speeds up such edge in the form of fast falling edges, as will be described). Subsequent signal recovery stages in embodiments including more than one such stage function to further speed up the signal edges in one edge direction and not the other.

The first signal recovery stage (or the only such stage in embodiments containing a single signal recovery stage as in FIG. 1) of a circuit branch includes the same type of current source as the just prior starved inverter stage to which it is coupled and is identical to the just prior starved inverter stage in all respects. Thus, signal recovery stage 64 includes a PMOS current source MP59 (i.e., since the just prior starved inverter stage 54 includes a PMOS current source MP57).

Signal recovery stage 64 has an input coupled to an output of the just prior starved inverter stage 54 (at which signal V3 is provided) and an output at which the first intermediate signal 24 is provided, as shown. Signal recovery stage 64 includes a PMOS current source MP59 coupled between a PMOS FET MP53 and an NMOS FET MN58, with the first intermediate signal 24 provided between FETs MP59 and MN58, as shown.

In operation, rising edges of V3 cause NMOS FET MN58 to turn on and PMOS FET MP53 to turn off, thereby causing the first intermediate signal 24 to rapidly fall to the level of VNEG so as to increase the speed of the falling edges of first intermediate signal 24 as compared to rising edges of signal V3. Falling edges of signal V3 cause PMOS FET MP53 to turn on and NMOS FET MN58 to turn off. PMOS current source MP59 limits the rise time of first intermediate signal 24, as shown. Thus, signal recovery stage 64 operates to invert signal V3, speed up falling edges of the first intermediate signal 24 as compared to rising edges of signal V3, and slow down rising edges of the first intermediate signal 24 as compared to falling edges of signal V3.

In this way, the first intermediate signal 24 can be described as having falling edges that are delayed and faster than rising edges of the digital input signal 20 and rising edges that are substantially coincident with respect to falling edges of the digital input signal (i.e., not delayed in time). The rising edges of the intermediate signal 24 can be slower or faster than the falling edge of the digital input signal 20, depending on the design.

The circuit branches 14, 18 are symmetrical with respect to each other. Thus, each such branch contains the same number of starved inverter stages and signal recovery stages, but of opposite types. Thus, in the example buffer 10 of FIG. 1, the second branch 18 includes two starved inverter stages 48, 58 and one signal recovery stage 68. Here however, the starved inverter stage 48 includes a PMOS current source MP58 (as contrasted to the NMOS current source MN94 in symmetrical stage 44 of the first branch 14), the starved inverter stage 58 includes an NMOS current source MN95 (as contrasted to the PMOS current source MP57 in symmetrical stage 54 of the first branch 14) and the signal recovery stage 68 includes an NMOS current source MN97 (as contrasted to the PMOS current source MP59 of symmetrical stage 64 of the first circuit branch 14).

Considering operation of the first inverter stage 48 of second circuit branch 18, rising edges of digital input signal 20 cause NMOS FET MN56 to turn on and PMOS FET MP50 to turn off, thereby causing signal V2 to rapidly fall to the level of VNEG to increase the speed of the falling edges of signal V2 with respect to rising edges of digital input signal 20. On the other hand, falling edges of the digital input signal 20 turn on PMOS FET MP50 and turn off NMOS FET MN56, thereby causing PMOS current source MP58 to limit the rise time of signal V2 so as to delay rising edges of signal V2 with respect to falling edges of digital input signal 20. Thus, inverter stage 48 generates a voltage V2 that is inverted with respect to digital input signal 20, has delayed rising edges with respect to falling edges of digital input signal 20, and has faster falling edges than rising edges of digital input signal 20.

Considering operation of the second inverter stage 58 of second circuit branch 18, falling edges of signal V2 cause PMOS FET MN48 to turn on and NMOS FET MN54 to turn off, thereby causing signal V4 to rapidly rise to the level of VPOS to increase the speed of the rising edges of signal V4 with respect to falling edges of signal V2. Rising edges of signal V2 cause NMOS FET MN54 to turn on and PMOS FET MN48 to turn off. NMOS current source MN95 limits the fall time of signal V4 and in this way delays falling edges of signal V4 with respect to rising edges of V2. Thus, the second starved inverter stage 58 of the second circuit branch 18 generates a voltage V4 that is inverted with respect to signal V2, has delayed falling edges with respect to rising edges of signal V2, and rising edges that are faster than the falling edges of signal V2.

Signal recovery stage 68 includes the same type of current source as the just prior starved inverter stage 58 to which it is coupled. Thus, signal recovery stage 68 includes an NMOS current source MN97 (i.e., since the just prior starved inverter stage 58 includes an NMOS current source MN95). The second intermediate signal 28 is provided at an output of the signal recovery stage 68, as is provided between FETs MP51 and MN97, as shown.

In operation, rising edges of V4 cause NMOS FET MN57 to turn on and PMOS FET MP51 to turn off. NMOS current source MN97 limits the fall time of the second intermediate signal 28, as shown. Falling edges of signal V4 cause PMOS FET MP51 to turn on and NMOS FET MN57 to turn off, thereby causing the second intermediate signal 28 to rapidly rise to the level of VPOS so as to increase the speed of the rising edges of second intermediate signal 28 as compared to falling edges of signal V4. Thus, signal recovery stage 68 operates to invert signal V4, speed up rising edges of the second intermediate signal 28 as compared to falling edges of signal V4, and slow down falling edges of the second intermediate signal 28 as compared to rising edges of signal V4.

In this way, the second intermediate signal 28 can be described as having rising edges that are delayed and faster than falling edges of the digital input signal 20 and falling edges that are substantially coincident with respect to rising edges of the digital input signal (i.e., not delayed in time). The falling edges of the intermediate signal 24 can be slower or faster than the rising edges of digital input signal 20, depending on the design.

As noted above, output stage 30 has a first input coupled to receive the first intermediate signal 24, a second input coupled to receive the second intermediate signal 28, and an output at which a buffer output signal DDS 32 is provided as a delayed version of the digital input signal 20 but with faster rising and falling edges than the digital input signal.

More particularly, output stage 30 includes a so-called "break before make" structure coupled across power connections VPOS, VNEG with which one signal path is opened before another is closed. Each CMOS switch MP9, MN31 of a first pair of switches is coupled to receive the first intermediate signal 24 and each CMOS switch of a second pair of switches MP25, MN15 is coupled to receive the second intermediate signal 28. The first pair of switches MP9, MN31 is interleaved with respect to the second pair of switches MP25, MN15, such that FET MP25 is coupled in series with FET MP9, FET MP9 is coupled in series with FET MN15, and FET MN15 is coupled in series with FET MN31, as shown.

In operation, rising edges of the first intermediate signal 24 cause FET MN31 to turn on and FET MP9 to turn off and falling edges of the first intermediate signal 24 cause FET MN31 to turn off and FET MP9 to turn on. Rising edges of the second intermediate signal 28 cause FET MN15 to turn on and FET MP25 to turn off and falling edges of the second intermediate signal 28 cause FET MN15 to turn off and FET MP25 to turn on.

Consideration of the first and second intermediate signals 24, 28 reveals that transitions (i.e., edges) of such signals do not overlap. As a result, there is never a time when all of the FETs MP25, MP9, MN15, and MN31 are on (i.e., at any given time, there is always at least one of these four switches that it turned off).

With this arrangement, after a rising edge of the digital input signal 20, the second intermediate signal 28 has a falling edge that ends before the first intermediate signal 24 has a falling edge. The falling edge of the second intermediate signal 28 does not impact the buffer output signal 32 since, during this transition, the first intermediate signal 24 is high. Since the falling edge of the first intermediate signal 24 is a fast edge, the rising edge of the buffer output signal 32 is fast, as shown in FIG. 2.

After a falling edge of the digital input signal 20, the first intermediate signal 24 has a rising edge that ends before the second intermediate signal 28 has a rising edge. The rising edge of the first intermediate signal 24 does not impact the buffer output signal 32 since, during this transition, the second intermediate signal 28 is low. Since the rising edge of the second intermediate signal 28 is a fast edge, the falling edge of the buffer output signal 32 is fast, as shown in FIG. 2.

It will be appreciated by those of ordinary skill in the art that the break before make structure of output stage 30 can be varied while still achieving benefits of the circuit. Alternative break before make structures are shown and described in connection with FIG. 4 below.

Figure 3:
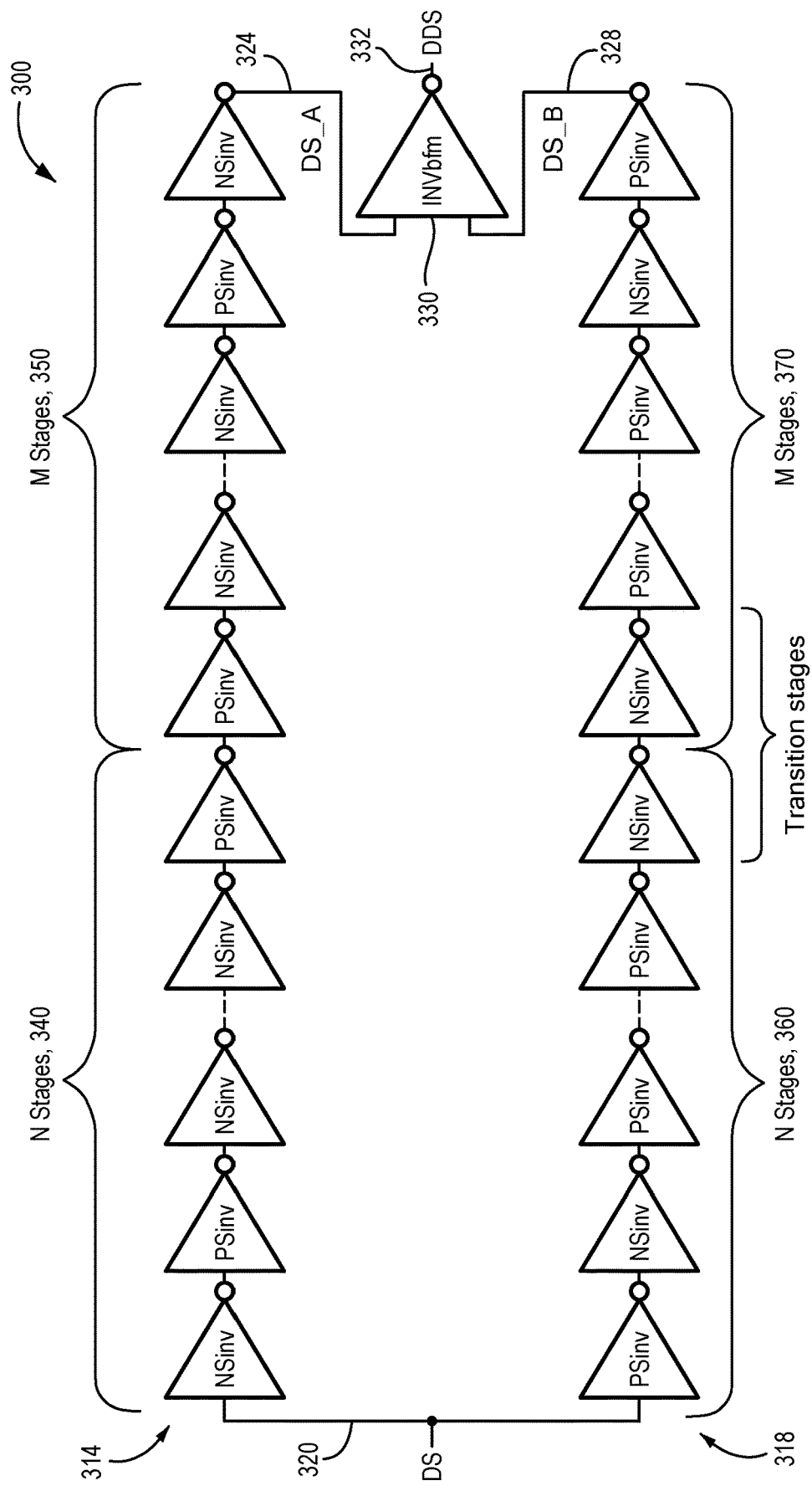
FIG. 3 is a block diagram of a buffer according to the disclosure.

Referring to FIG. 3, in general, a buffer 300 according to the disclosure can be described as including a first circuit branch 314 and a second circuit branch 318, each including one or more starved inverter stages 340, 360, and one or more signal recovery stage 350, 370, coupled as shown. The first starved inverter stage of each circuit branch 314, 318 is coupled to receive a digital input signal 320.

The last signal recovery stage of the first branch 314 is configured to generate a first intermediate signal 324 (that can be the same as or similar to first intermediate signal 24 of FIGS. 1 and 2) and the last signal recovery stage of the second branch 318 is configured to generate the second intermediate signal 328 (that can be the same as or similar to the second intermediate signal 28 of FIGS. 1 and 2). Thus, the first intermediate signal 324 can be described as having falling edges that are delayed and faster than rising edges of the digital input signal 320 and rising edges that are substantially coincident with respect to falling edges of the digital input signal (i.e., not delayed in time) and the second intermediate signal 328 can be described as having rising edges that are delayed and faster than falling edges of the digital input signal 320 and falling edges that are substantially coincident with respect to rising edges of the digital input signal (i.e., not delayed in time).

Output stage 330 is coupled to receive the first intermediate signal 324 and the second intermediate signal 328 and can operate in a break before make fashion to generate the buffer output signal 332 that can be the same as or similar to buffer output signal 32 of FIG. 1. Thus, buffer output signal 332 is a version of the digital input signal 320, but with faster rising and falling edges. The buffer output signal 332 may or may not be inverted with respect to the digital input signal 320. If there are an even number of inversions in the inverter chain, then the buffer output signal 332 is not inverted with respect to the input signal 320; whereas, if there are an odd number of inversions in the inverter chain, then the buffer output signal 332 is inverted with respect to the input signal 320.

The circuit branches 314, 318 are symmetrical with respect to each other in the sense that each branch contains the same number of starved inverter stages 340, 360 and signal recovery stages 350, 370, but of opposite types. For example, each starved inverter stage 340 of the first circuit branch 314 including an NMOS current source has a symmetrical starved inverter stage 360 of the second circuit branch 318 including a PMOS current source.

The first signal recovery stage in each circuit branch is of the same type as the just prior starved inverter stage, in which case such directly connected stages can be referred to as transition stages, as shown. Thus, for example, in circuit branch 314, the first signal recovery stage of stages 350 includes a PMOS current source since the last starved inverter stage of stages 340 includes a PMOS current source.

In both circuit branches 314, 318, the number of starved inverter stages "N" can be one or more and similarly, the number of signal recovery stages "M" can be one or more. In the context of example buffer 10 of FIGS. 1, N=2 and M=1. The larger the number N (i.e., the more starved inverter stages), the greater the delay in the buffer output signal with respect to the buffer input signal. Further, the larger the number M (i.e., the more signal recovery stages), the faster the signal edges of the buffer output signal are with respect to the speed of the signal edges of the buffer input signal.

Figure 4:
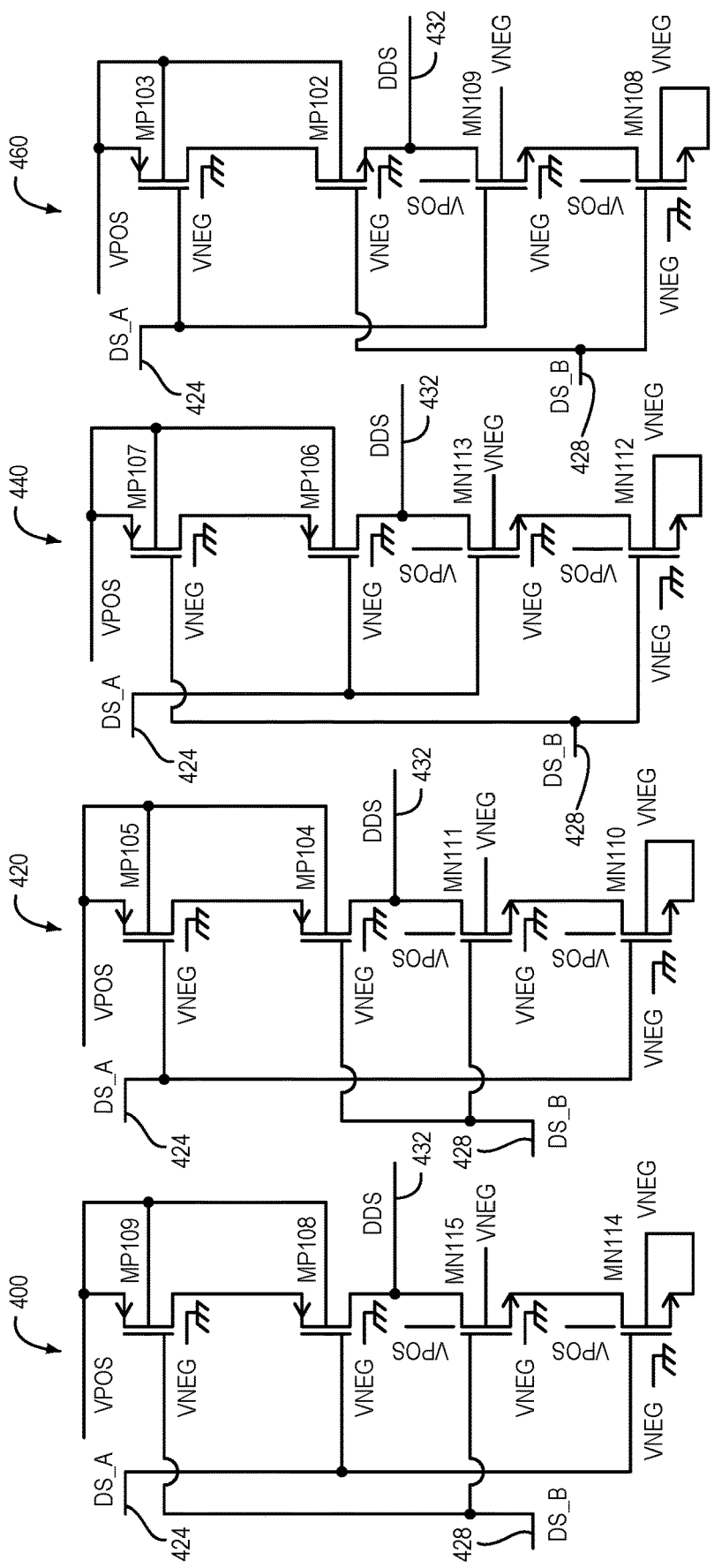
FIG. 4 shows break before make structures of a buffer according to the disclosure.

Referring to FIG. 4, various break before make structures 400, 420, 440, 460 are shown, any of which may be used to provide the buffer output stage according to the disclosure. In other words, any of structures 400, 420, 440, 460 can be used to provide the output stage 30 of buffer 10 of FIG. 1.

Example break before make structure 400 is like the output stage 30 of FIG. 1 in that it includes a series coupling of a PMOS FET MP109, a PMOS FET MP108, an NMOS FET MN115, and an NMOS FET MN114, coupled in series between the positive supply voltage VPOS and the negative supply voltage VNEG, with the output signal 432 provided between FETS MP108 and MN115, as shown. A first intermediate signal 424 (that can be the same as or similar to first intermediate signal 24 of FIG. 1) is coupled to control FETs MP108 and MN114 and a second intermediate signal 428 (that can be the same as or similar to the second intermediate signal 28 of FIG. 1) is coupled to control FETs MP109 and MN115.

Because of the nature of the first and second intermediate signals 424, 428 as having non-overlapping transition times, there will never be a time when all of the FETs MP109, MP108, MN115, MN114 are on (i.e., at any given time, there is always at least one of these four switches that it turned off). Further, in buffer embodiments including the break before make structure 400, the buffer output signal 432 is a delayed and inverted version of the input signal, but with faster edges.

Break before make structure 400 can be more desirable than the other illustrated examples because the FETs connected to the positive supply VPOS and the negative supply VNEG are controlled by the intermediate signal that has a slower transition time in the direction of the coupled voltage rail, thereby allowing to bring the node that connects the transistors to the rails before the delayed but fast signal switches the output of the structure 400. For example, PMOS FET MP109 that is coupled to the positive supply VPOS is controlled by the second intermediate signal 428, which signal has slower falling edges than rising edges (see like signal 28 in FIG. 2). Similarly, NMOS FET 114 that is coupled to the negative supply VNEG is controlled by the first intermediate signal 424, which signal has slower rising edges than falling edges (see like signal 24 in FIG. 2).

Example break before make structure 420 includes a series coupling of a PMOS FET MP105, a PMOS FET MP104, an NMOS FET MN111, and an NMOS FET MN110, coupled in series between the positive supply voltage VPOS and the negative supply voltage VNEG, with the output signal 432 provided between FETs MP104 and MN111, as shown. A first intermediate signal 424 (that can be the same as or similar to first intermediate signal 24 of FIG. 1) is coupled to control FETs MP105 and MN110 and a second intermediate signal 428 (that can be the same as or similar to the second intermediate signal 28 of FIG. 1) is coupled to control FETs MP104 and MN111.

Because of the nature of the first and second intermediate signals 424, 428 as having non-overlapping transition times, there will never be a time when all of the FETs MP105, MP104, MN111, MN110 are on (i.e., at any given time, there is always at least one of these four switches that it turned off). Further, in buffer embodiments including the break before make structure 420, the buffer output signal 432 is a delayed and inverted version of the input signal, but with faster edges.

Further example break before make structure 440 includes a series coupling of a PMOS FET MP107, a PMOS FET MP106, an NMOS FET MN113, and an NMOS FET MN112, coupled in series between the positive supply voltage VPOS and the negative supply voltage VNEG, with the output signal 432 provided between FETs MP106 and MN113, as shown. A first intermediate signal 424 (that can be the same as or similar to first intermediate signal 24 of FIG. 1) is coupled to control FETs MP106 and MN113 and a second intermediate signal 428 (that can be the same as or similar to the second intermediate signal 28 of FIG. 1) is coupled to control FETs MP107 and MN112.

Because of the nature of the first and second intermediate signals 424, 428 as having non-overlapping transition times, there will never be a time when all of the FETs MP107, MP106, MN113, MN112 are on (i.e., at any given time, there is always at least one of these four switches that it turned off). Further, in buffer embodiments including the break before make structure 440, the buffer output signal 432 is a delayed and inverted version of the input signal, but with faster edges.

Final example break before make structure 460 includes a series coupling of a PMOS FET MP103, a PMOS FET MP102, an NMOS FET MN109, and an NMOS FET MN108, coupled in series between the positive supply voltage VPOS and the negative supply voltage VNEG, with the output signal 432 provided between FETs MP102 and MN109, as shown. A first intermediate signal 424 (that can be the same as or similar to first intermediate signal 24 of FIG. 1) is coupled to control FETs MP103 and MN109 and a second intermediate signal 428 (that can be the same as or similar to the second intermediate signal 28 of FIG. 1) is coupled to control FETs MP102 and MN108.

Because of the nature of the first and second intermediate signals 424, 428 as having non-overlapping transition times, there will never be a time when all of the FETs MP103, MP102, MN109, MN108 are on (i.e., at any given time, there is always at least one of these four switches that it turned off). Further, in buffer embodiments including the break before make structure 460, the buffer output signal 432 is a delayed and inverted version of the input signal, but with faster edges.

Figure 5:
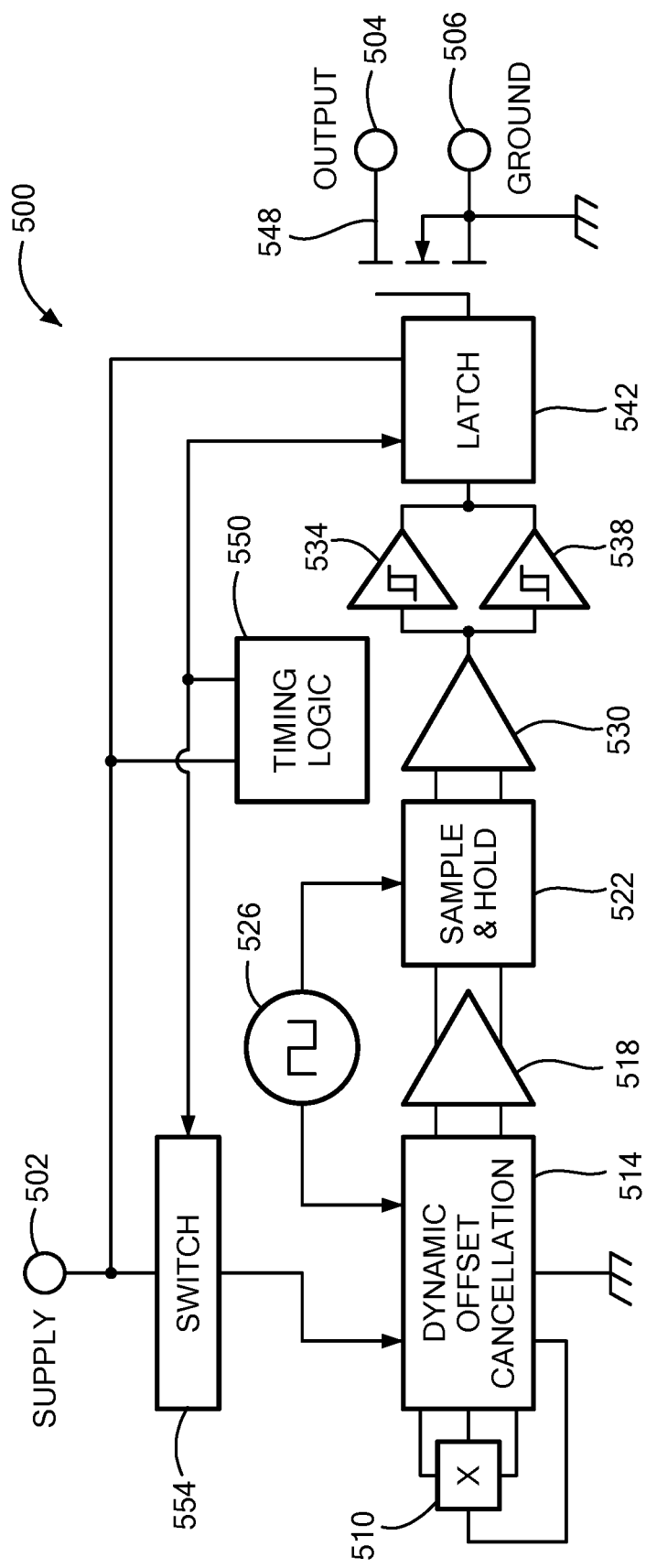
FIG. 5 illustrates an example magnetic field switch sensor application utilizing a buffer according to the disclosure.

Referring to FIG. 5, an example low power magnetic switch 500 illustrates an application for the above-described digital buffer 10 (FIG. 1). The low power switch 500 can be provided in the form of an integrated circuit with power connections as a SUPPLY pin 502 and a GROUND pin 506, and an OUTPUT pin 504 at which a switch output signal is provided.

The switch 500 includes a magnetic field sensing element 510 configured to sense a magnetic field in a specific direction to the element and provide an output signal 548 at a MOSFET driven output pin 504. The switch output signal 548 changes state when the magnetic field exceeds an operate threshold (e.g., switches to a low state when the output switch turns on) and changes state when the magnetic field falls below a release threshold (e.g., to a high state when the output switch turns off). In some embodiments, the switch 500 can operate in a pole independent manner such that either a north or south magnetic pole of sufficient strength will turn on the output and in the absence of a magnetic field, the output is off.

In embodiments, the magnetic field sensing element 510 can be provided in the form of a network of elements coupled in a Wheatstone bridge configuration. The switch 500 can include dynamic offset cancellation circuit 514 that implements a chopper stabilization technique to reduce offset associated with mismatches amongst the magnetic field sensing elements. To this end, dynamic offset cancellation circuit 514 can be configured to change the direction of current flowing through the Hall plate using CMOS switches. An amplifier 518 can process the chopped Hall signals and be coupled to a sample-and-hold circuit 522 to generate a magnetic field signal for further processing. An oscillator 526 can provide a clock signal to the dynamic offset cancellation circuit 514 and sample-and-hold circuit 522, as shown.

Low power switch 500 includes timing circuitry 550 that remains on during most of the circuit operational time in order to activate system components for short "awake" intervals during each clock period and deactivate system components during longer "sleep" intervals of the clock periods. Under control of the timing logic 550, a switch 554 can implement activation and deactivation of system components including the dynamic offset cancellation circuit 514. This arrangement provides lower average power consumption than would be otherwise possible with all of the system components on at all times. Timing circuitry 550 can include a buffer that is the same as or similar to buffer 10 of FIG. 1 and thus, that can provide an output signal in the form of a delayed version of the input signal, with or without signal inversion, but with faster edges.

A buffer 530 can provide an output signal coupled to comparators 534, 538 for comparison to the operate and release thresholds. The operate and release thresholds can be selected to implement hysteresis so as to ensure clean switching of the output signal 548 even in the presence of external mechanical vibration and electrical noise. The comparator outputs are logically combined and latched by latch 542. The latch output is coupled to drive the output MOS device, as shown.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A digital buffer comprising:
   a first branch configured to receive a digital input signal and generate a first intermediate signal having falling edges that are delayed and faster than rising edges of the digital input signal and rising edges that are substantially coincident with falling edges of the digital input signal;
   a second branch configured to receive the digital input signal and generate a second intermediate signal having rising edges that are delayed and faster than falling edges of the digital input signal and falling edges that are substantially coincident with rising edges of the digital input signal; and
   an output stage having a first input coupled to receive the first intermediate signal, a second input coupled to receive the second intermediate signal, and an output at which a buffer output signal is provided, wherein the buffer output signal is a delayed version of the digital input signal having faster rising and falling edges than the digital input signal.

2. The buffer of claim 1, wherein each of the first branch and the second branch comprises:
   at least one starved inverter stage having an input node coupled to receive the digital input signal and an output node; and
   at least one signal recovery stage having an input node coupled to the output node of the at least one starved inverter stage and an output node at which the first intermediate signal or the second intermediate signal is provided.

3. The buffer of claim 2, wherein the at least one starved inverter stage comprises a CMOS inverter and current source, wherein the current source is a PMOS current source or an NMOS current source.

4. The buffer of claim 3, wherein the at least one signal recovery stage comprises a CMOS inverter and current source, wherein the current source is a PMOS current source or an NMOS current source.

5. The buffer of claim 4, wherein the at least one signal recovery stage comprises the same type of current source as the at least one starved inverter stage to which it is coupled.

6. The buffer of claim 2, wherein each of the first branch and the second branch comprises:
   a plurality of series-coupled starved inverter stages with a first one coupled to receive the digital input signal and a last one having the output node coupled to the at least one signal recovery stage.

7. The buffer of claim 2, wherein each of the first branch and the second branch comprises:
a plurality of series-coupled signal recovery stages with a first one coupled to the output node of the at least one starved inverter stage and a last one having an output node at which the first intermediate signal or the second intermediate signal is provided.

8. The buffer of claim 1, wherein the output stage comprises a break before make structure coupled across power connections and including a first pair of CMOS switches, each coupled to receive the first intermediate signal and a second pair of CMOS switches, each coupled to receive the second intermediate signal, wherein the first pair of CMOS switches is interleaved with respect to the second pair of CMOS switches.

9. A method for generating a buffer output signal having faster edges than a digital input signal, comprising:
generating a first intermediate signal having delayed and faster falling edges with respect to rising edges of the digital input signal;
generating a second intermediate signal having delayed and faster rising edges with respect to falling edges of the digital input signal; and
combining the first and second intermediate signals to generate the buffer output signal as a delayed version of the digital input signal having faster rising and falling edges than the digital input signal.

10. The method of claim 9, wherein combining the first and second intermediate signals comprises coupling the first and second intermediate signals to a break before make structure coupled across power connections.

11. The method of claim 10, wherein coupling the first and second intermediate signals to a break before make structure comprises:
coupling the first intermediate signal to a first pair of CMOS switches comprising a PMOS switch and an NMOS switch; and
coupling the second intermediate signal to a second pair of CMOS switches comprising a PMOS switch and an NMOS switch, wherein the first pair of CMOS switches is interleaved with the second pair of CMOS switches.

12. The method of claim 9, wherein generating the first intermediate signal comprises coupling the digital input signal to a first branch comprising at least one starved inverter stage having an input node coupled to receive the digital input signal and an output node and at least one signal recovery stage having an input node coupled to the output node of the at least one starved inverter stage and an output node at which the first intermediate signal is provided and wherein generating the second intermediate signal comprises coupling the digital input signal to a second branch comprising at least one starved inverter stage having an input node coupled to receive the digital input signal and an output node and at least one signal recovery stage having an input node coupled to the output node of the at least one starved inverter stage and an output node at which the second intermediate signal is provided.

13. The method of claim 12, wherein generating the first intermediate signal comprises coupling the digital input signal to a first one of a plurality of series-coupled starved inverter stages, with a first one coupled to receive the digital input signal and a last one having the output node coupled to the at least one signal recovery stage and wherein generating the second intermediate signal comprises coupling the digital input signal to a first one of a plurality of series-coupled starved inverter stages, with a first one coupled to receive the digital input signal and a last one having the output node coupled to the at least one signal recovery stage.

14. The method of claim 13, wherein generating the first intermediate signal further comprises coupling the last one of the plurality of series-coupled starved inverter stages of the first branch to a first one of a plurality of series-coupled signal recovery stages, wherein the first intermediate signal is generated by a last one of the plurality of series-coupled signal recovery stages of the first branch and wherein generating the second intermediate signal further comprises coupling the last one of the plurality of series-coupled starved inverter stages of the second branch to a first one of a plurality of series-coupled signal recovery stages, wherein the second intermediate signal is generated by a last one of the plurality of series-coupled signal recovery stages of the second branch.

* * * * *